(12) United States Patent
Chae

(10) Patent No.: US 7,657,803 B2
(45) Date of Patent: Feb. 2, 2010

(54) MEMORY CONTROLLER WITH A SELF-TEST FUNCTION, AND METHOD OF TESTING A MEMORY CONTROLLER

(75) Inventor: Kwan-Yeob Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 11/821,626

(22) Filed: Jun. 25, 2007

(65) Prior Publication Data

US 2008/0016420 A1    Jan. 17, 2008

(30) Foreign Application Priority Data

Jul. 11, 2006    (KR)    ............... 10-2006-0064823

(51) Int. Cl.
  G11C 29/00    (2006.01)
  G11C 7/00    (2006.01)
  G01R 31/28    (2006.01)
(52) U.S. Cl. .............. 714/718; 714/734; 714/742; 365/201
(58) Field of Classification Search ......... 714/718, 714/734, 742; 365/201
See application file for complete search history.

(56) References Cited

U.S. PATENT DOCUMENTS

| | | | | |
|---|---|---|---|---|
| 4,339,819 | A * | 7/1982 | Jacobson ............... | 714/734 |
| 5,657,443 | A * | 8/1997 | Krech, Jr. ............... | 714/42 |
| 6,016,525 | A | 1/2000 | Corrigan et al. | |
| 6,397,357 | B1 * | 5/2002 | Cooper ............... | 714/703 |
| 6,802,023 | B2 * | 10/2004 | Oldfield et al. ............... | 714/7 |
| 7,085,972 | B2 * | 8/2006 | Borri et al. ............... | 714/710 |
| 7,305,595 | B2 * | 12/2007 | Goodwin et al. ............... | 714/718 |
| 7,333,908 | B2 * | 2/2008 | Johnson ............... | 702/120 |

(Continued)

FOREIGN PATENT DOCUMENTS

JP    2002-23844    1/2002

(Continued)

OTHER PUBLICATIONS

"A Hybrid Approach to the Test of Cache Memory Controllers Embedded in SoCs" by Perez et al. This paper appears in: On-Line Testing Symposium, 2008. IOLTS '08. 14th IEEE International Publication Date: Jul. 7-9, 2008 On pp. 143-148 ISBN: 978-0-7695-3264-6 INSPEC Accession No. 10076689.*

(Continued)

*Primary Examiner*—Cynthia Britt
(74) *Attorney, Agent, or Firm*—Mills & Onello, LLP

(57) ABSTRACT

A memory controller with a self-test function includes a test controlling unit configured to generate test data in a test mode, a data transmission unit configured to generate a data read timing signal to transmit the data read timing signal and the generated test data synchronized with the data read timing signal, and a data input/output (I/O) unit configured to feedback the transmitted test data and the transmitted data read timing signal to the data transmission unit, such that the data transmission unit receives fed-back test data and a fed-back data read timing signal. The data transmission unit reads the fed-back test data based on the fed-back data read timing signal, and the test controlling unit compares the fed-back test data with the generated test data. Therefore, the memory controller may perform a fast self-test.

20 Claims, 8 Drawing Sheets

U.S. PATENT DOCUMENTS

| | | | |
|---|---|---|---|
| 7,464,307 B2 * | 12/2008 | Nejedlo et al. | 714/712 |
| 7,478,287 B2 * | 1/2009 | Funaba et al. | 714/700 |
| 7,496,819 B2 * | 2/2009 | Kumar et al. | 714/734 |
| 2002/0145441 A1 * | 10/2002 | Shiraishi | 324/765 |
| 2003/0237033 A1 * | 12/2003 | Borri et al. | 714/718 |
| 2005/0060604 A1 * | 3/2005 | Goodwin et al. | 714/7 |
| 2005/0188255 A1 * | 8/2005 | Kumar et al. | 714/7 |

FOREIGN PATENT DOCUMENTS

| | | |
|---|---|---|
| KR | 2000-0027054 | 5/2000 |
| KR | 10-0513820 | 9/2005 |

OTHER PUBLICATIONS

"Testability features in a high-density memory module" by Parrella, E.L. This paper appears in: ASIC Seminar and Exhibit, 1990. Proceedings., Third Annual IEEE Publication Date: Sep. 17-21, 1990 on pp. P3/1.1-P3/1.3 Meeting Date: Sep. 17, 1990-Sep. 21, 1990 INSPEC Accession No. 4111838.*

* cited by examiner

300

MEMORY CONTROLLER WITH A SELF-TEST FUNCTION, AND METHOD OF TESTING A MEMORY CONTROLLER

CROSS-REFERENCE TO RELATED APPLICATIONS

This application claims priority under 35 USC § 119 to Korean Patent Application No. 10-2006-0064823, filed on Jul. 11, 2006 in the Korean Intellectual Property Office (KIPO), the contents of which are incorporated herein in their entirety by reference.

BACKGROUND OF THE INVENTION

1. Field of the Invention

The present invention relates to a memory controller, and more particularly to a memory controller with a self-test function and a method of testing a memory controller.

2. Description of the Related Art

Generally, semiconductor memory devices are used for storing data, and are adopted in various digital devices such as computers, mobile communication devices and so on. The semiconductor memory devices may include a random-access memory (RAM) device and a read-only memory (ROM) device.

The RAM device is a kind of volatile memory device that loses stored data when power is turned off, and may further include dynamic RAM (DRAM) that needs a periodic refresh operation or static RAM (SRAM) that adopts a flip-flop structure.

Generally, a DRAM device adopts various structures to increase operation speed, and needs a memory controller to be properly operated in a computing system.

However, testing the memory controller is very difficult due to the introduction of various memory devices having high operation speed such as a double data rate (DDR) DRAM and DDR2 DRAM. Also, the time required for testing the memory controller is increased when an external memory controller test device is used for a memory controller test.

SUMMARY OF THE INVENTION

Accordingly, the present invention is provided to substantially obviate one or more problems due to limitations and disadvantages of the related art.

Some embodiments of the present invention provide a memory controller with a self-test function capable of performing a fast self-test.

Other embodiments of the present invention provide a double data rate (DDR) memory controller with a self-test function capable of performing a fast self-test.

Still other embodiments of the present invention provide a method of testing a memory controller capable of performing a fast self-test.

According to one aspect, the present invention is directed to a memory controller with a self-test function, which includes a test controlling unit configured to generate test data in a test mode, a data transmission unit configured to generate a data read timing signal to transmit the data read timing signal and the generated test data synchronized with the data read timing signal, and a data input/output (I/O) unit configured to feed back the transmitted test data and the transmitted data read timing signal to the data transmission unit, such that the data transmission unit receives fed-back test data and a fed-back data read timing signal. The data transmission unit reads the fed-back test data based on the fed-back data read timing signal, and the test controlling unit compares the fed-back test data with the generated test data.

The data transmission unit may generate a data write timing signal and may transmit the generated data write timing signal and non-test data synchronized with the generated data write timing signal, in a non-test mode.

The data transmission unit may include a data timing block configured to generate the data read timing signal and configured to transmit the generated data read timing signal, and a data write block configured to transmit the generated test data synchronized with the generated data read timing signal to the data I/O unit.

The data transmission unit may further include a data read block configured to receive the fed-back test data and the fed-back data read timing signal from the data I/O unit, and configured to read the received fed-back test data based on the fed-back data read timing signal.

In one example embodiment, the data I/O unit may directly feed back the transmitted test data and the transmitted data read timing signal.

In another example embodiment, the data I/O unit may feed back the transmitted test data that is to be outputted to an external source and the transmitted data read timing signal that is to be outputted to the external source. For example, the external source may correspond to one of a memory device and a memory controller test device.

The data I/O unit may include a data feedback circuit configured to feed back the transmitted test data that is to be outputted to an external source, and a data timing feedback circuit configured to feed back the transmitted data read timing signal that is to be outputted to the external source.

The data I/O unit may directly feed back the transmitted test data and the transmitted data read timing signal, or may feed back the transmitted test data to that is be outputted to an external source and the transmitted data read timing signal that is to be outputted to the external source, based on an internal loop control signal received from the test controlling unit.

The data I/O unit may include a selection unit configured to select one of first signals and second signals based on the internal loop control signal, the first signals corresponding to the direct fed-back test data and the direct fed-back data read timing signal, and the second signals corresponding to the transmitted test data that is to be outputted to an external source and the transmitted data read timing signal that is to be outputted to the external source.

The data I/O unit may include a data feedback circuit configured to feed back the generated test data that is to be outputted to the external source, and a data timing feedback circuit configured to feed back the generated data read timing signal that is to be outputted to the external source.

The test controlling unit may determine an operation mode based on a test control signal received from an external source, the operation mode including one of the test mode and the non-test mode. For example, the external source may correspond to one of a central processing unit (CPU) and a memory controller test device.

According to another aspece, the present invention is directed to a double data rate (DDR) memory controller with a self-test function, which includes a test controlling unit configured to generate test data in a test mode, a data transmission unit configured to generate a data read strobe signal to transmit the data read strobe signal and the generated test data synchronized with the data read strobe signal, and a data I/O unit configured to feed back the transmitted test data and the transmitted data read strobe signal to the data transmission unit, such that the data transmission unit receives fed-back test data and a fed-back data read strobe signal, and wherein the data transmission unit reads the fed-back test data based on the fed-back data read strobe signal, and the test controlling unit compares the fed-back test data with the generated test data.

The data transmission unit may generate a data write strobe signal and transmits the generated data write timing signal and non-test data synchronized with the generated data write strobe signal, in a non-test mode.

The data transmission unit may include a data timing block configured to generate the data read strobe signal and configured to transmit the generated data read strobe signal, and a data write block configured to transmit the generated test data synchronized with the generated data read strobe signal to the data I/O unit.

The data transmission unit may further include a data read block configured to receive the fed-back test data and the fed-back data read strobe signal from the data I/O unit, and configured to read the received fed-back test data based on the fed-back data read strobe signal.

The data I/O unit may directly feed back the transmitted test data and the transmitted data read strobe signal, or may feed back the transmitted test data that is to be outputted to an external source and the transmitted data read strobe signal that is to be outputted to the external source, based on an internal loop control signal received from the test controlling unit.

According to another aspect, the present invention is directed to a method of testing a memory controller includes generating test data in a test mode, generating a data read timing signal to transmit the generated test data synchronized with the data read timing signal and the data read timing signal, feeding back the transmitted test data and the transmitted data read timing signal to generate fed-back test data and a fed-back data read timing signal, and reading the fed-back test data based on the fed-back data read timing signal to compare the fed-back test data with the generated test data.

Feeding back the transmitted test data and the transmitted data read timing signal may include directly feeding back the transmitted test data and the transmitted data read timing signal, or feeding back the transmitted test data that is to be outputted to an external source and the transmitted data read timing signal that is to be outputted to the external source.

Therefore, the present invention may feed back data and a data timing signal to perform a fast self-test.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
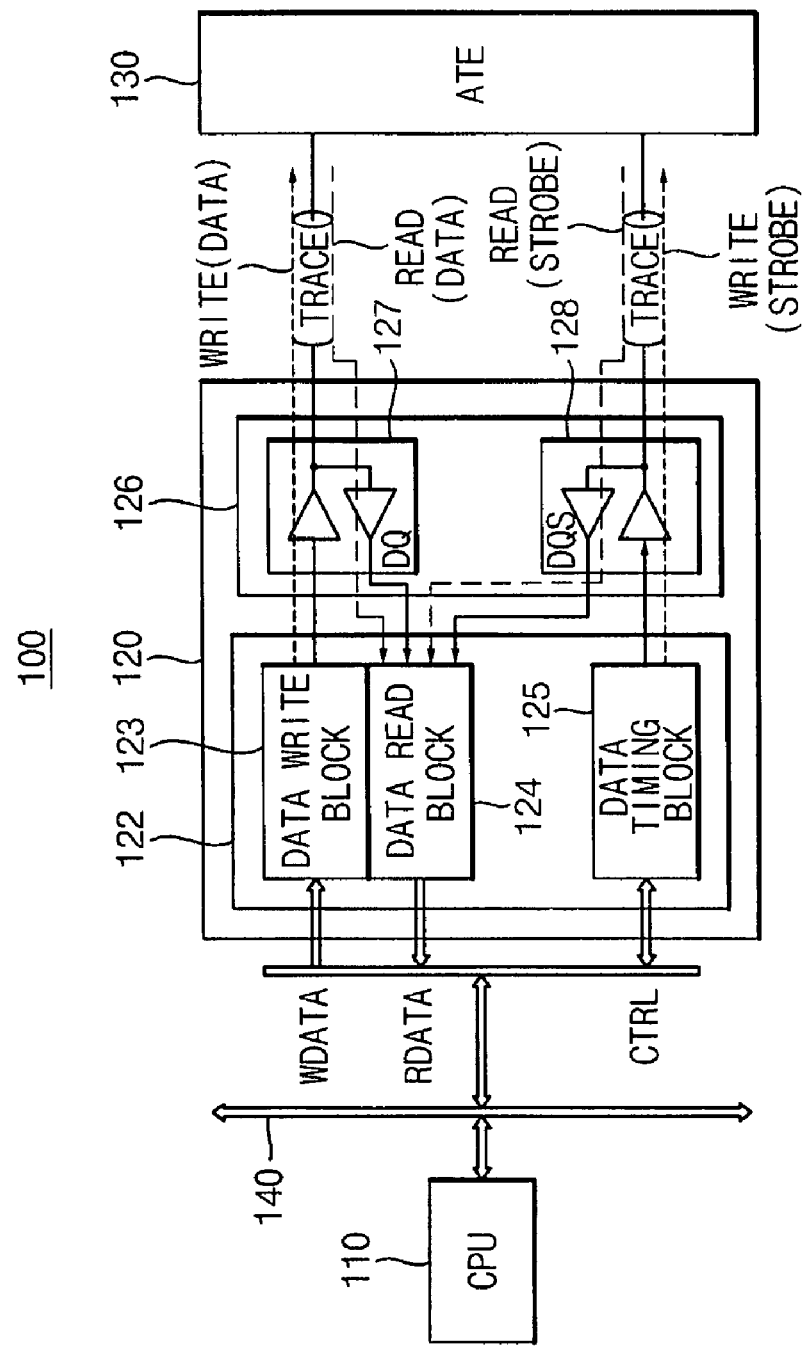
FIG. 1 is a block diagram illustrating a system for testing a general memory controller controlling a double data rate (DDR) dynamic random-access memory (DRAM).

Embodiments of the present invention now will be described more fully with reference to the accompanying drawings, in which embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention now will be described more fully hereinafter with reference to the accompanying figures, in which embodiments of the invention are shown. However, it should be understood that there is no intent to limit the invention to the particular forms disclosed, but on the contrary, the invention is to cover all modifications, equivalents, and alternatives falling within the spirit and scope of the invention as defined by the claims.

FIG. 1 is a block diagram illustrating a system for testing a general memory controller controlling a double data rate (DDR) dynamic random-access memory (DRAM).

Referring to FIG. 1, the system 100 includes a central processing unit (CPU) 110, a memory controller 120, a memory controller test device (automatic test equipment ATE) 130 and a system bus 140.

The CPU 110 is a device for controlling an overall system and transmits a read and/or write command to the memory controller test device 130, and tests whether data that is written into a memory device (not shown) or the memory controller test device 130 is the same as data that is read therefrom.

The memory controller 120 includes a data transmission unit 122 and a data input/output (I/O) unit 126.

The data transmission unit 122 includes a data write block 123, a data read block 124 and a data timing block 125, and performs a data transmission.

The data write block 123 receives a data write command from the CPU 110 and writes data to the memory controller test device 130. The data read block 124 receives a data read command from the CPU 110 and receives data and a data read strobe signal from the memory controller test device 130 to read received data. The data timing block 125 generates a data write strobe signal when data is written into the memory device (not shown) or the memory controller test device 130.

The data I/O unit 126 includes a data I/O block 127 and a data timing I/O block 128, and performs data I/O and data timing I/O, respectively.

The data I/O block 127 transmits data transmitted from the CPU 110 and the memory controller test device 130, and the data timing I/O block 128 transmits a data timing signal transmitted from the CPU 110 and the memory controller test device 130.

The memory controller test device 130 may be a test device for a semiconductor memory device and may be replaced with a DDR DRAM device.

Figure 2:
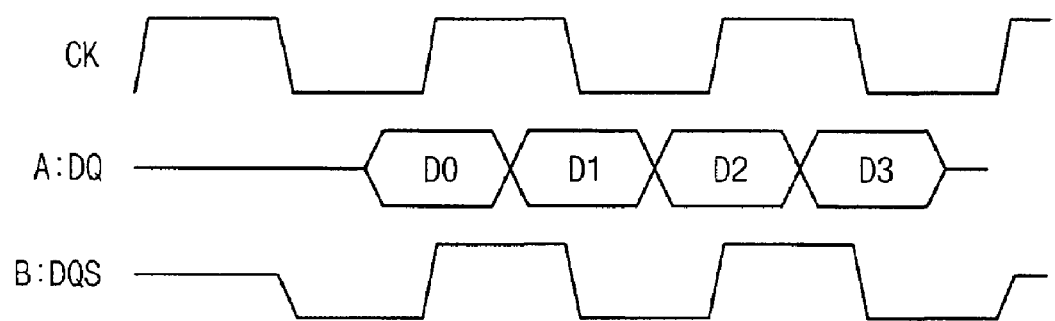
FIG. 2 is a timing diagram illustrating a data write procedure where a memory controller writes data into a DDR DRAM device.
Figure 3:
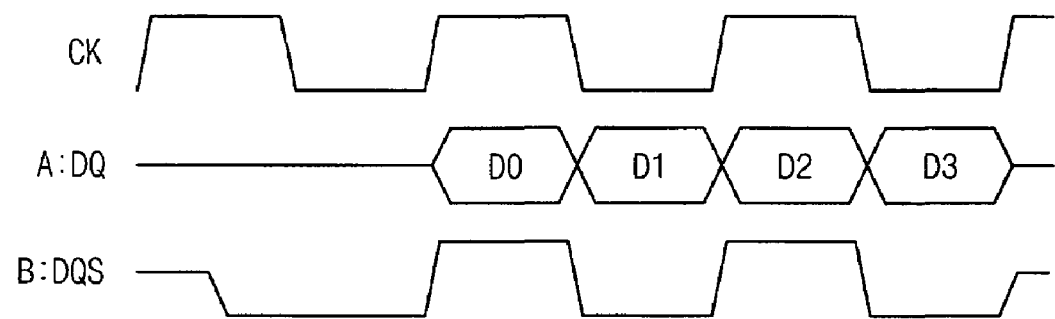
FIG. 3 is a timing diagram illustrating a data read procedure where a memory controller reads data from a DDR DRAM device.

FIG. 2 is a timing diagram illustrating a data write procedure where a memory controller writes data into a DDR DRAM device, and FIG. 3 is a timing diagram illustrating a data read procedure where a memory controller reads data from a DDR DRAM device.

In FIG. 2, the memory controller 120 in FIG. 1 writes data into the memory device such as a DDR DRAM device or the memory controller test device 130. A data signal DQ is aligned with a rising edge and a falling edge of a data write strobe signal DQS.

In FIG. 3, the memory controller 120 in FIG. 1 reads data from the memory device such as a DDR DRAM device or the memory controller test device 130. A data signal DQ is aligned with the center of a data read strobe signal DQS.

Hereinafter, a procedure for testing a memory controller according to the invention will be described.

The memory controller 120 receives a write command and data from the CPU 110, and generates a data write strobe signal DQS. In order to output the data to the memory device such as the DDR DRAM device or the memory controller test device 130, the memory controller 120 aligns the data with a rising edge and a falling edge of the data write strobe signal DQS to output the aligned data.

Also, the memory controller 120 receives a read command from the CPU 110, and reads data from the memory device such as the DDR DRAM device or the memory controller test device 130. The memory controller 120 receives a data read strobe signal DQS and data from the memory device or the memory controller test device 130, and reads the received data based on the data read strobe signal DQS to transmit the read data to the CPU 110.

The CPU 110 compares the data that is written to the memory device (not shown) or the memory controller test device 130 and the data that is read from the memory device (not shown) or the memory controller test device 130 to perform a test operation.

Figure 4:
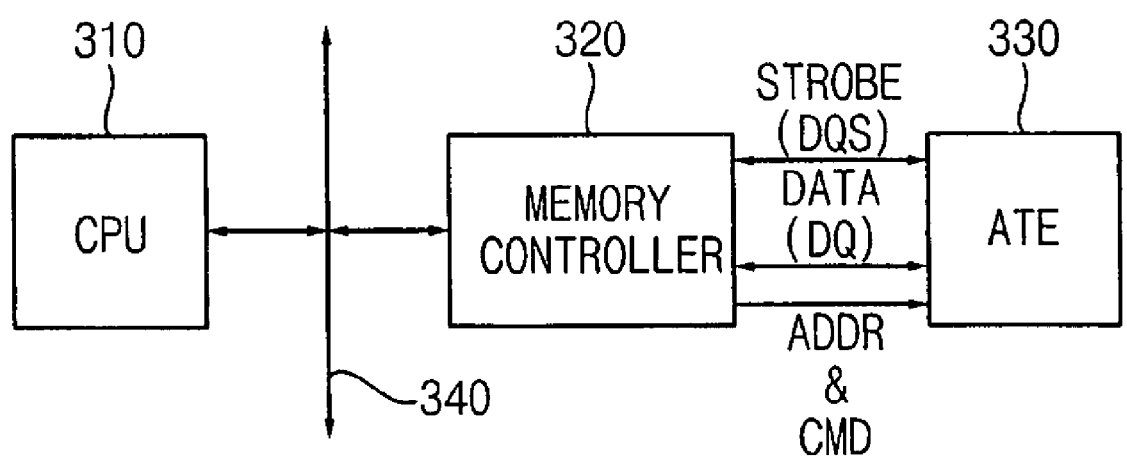
FIG. 4 is a block diagram illustrating a system for testing a memory controller according to an example embodiment of the present invention.

FIG. 4 is a block diagram illustrating a system for testing a memory controller according to an example embodiment of the present invention.

Referring to FIG. 4, the system 300 includes a CPU 310, a memory controller 320, automatic test equipment (ATE) 330 and a system bus 340.

The CPU 310 is a device for controlling an overall system and controls the memory controller 320 by using the system bus 340.

The ATE 330 may include a memory device and a memory controller test device. In a non-test mode, the ATE 330 may correspond to the memory device, and in a test mode, the ATE 330 may correspond to one of the memory device and the memory controller test device.

Figure 5:
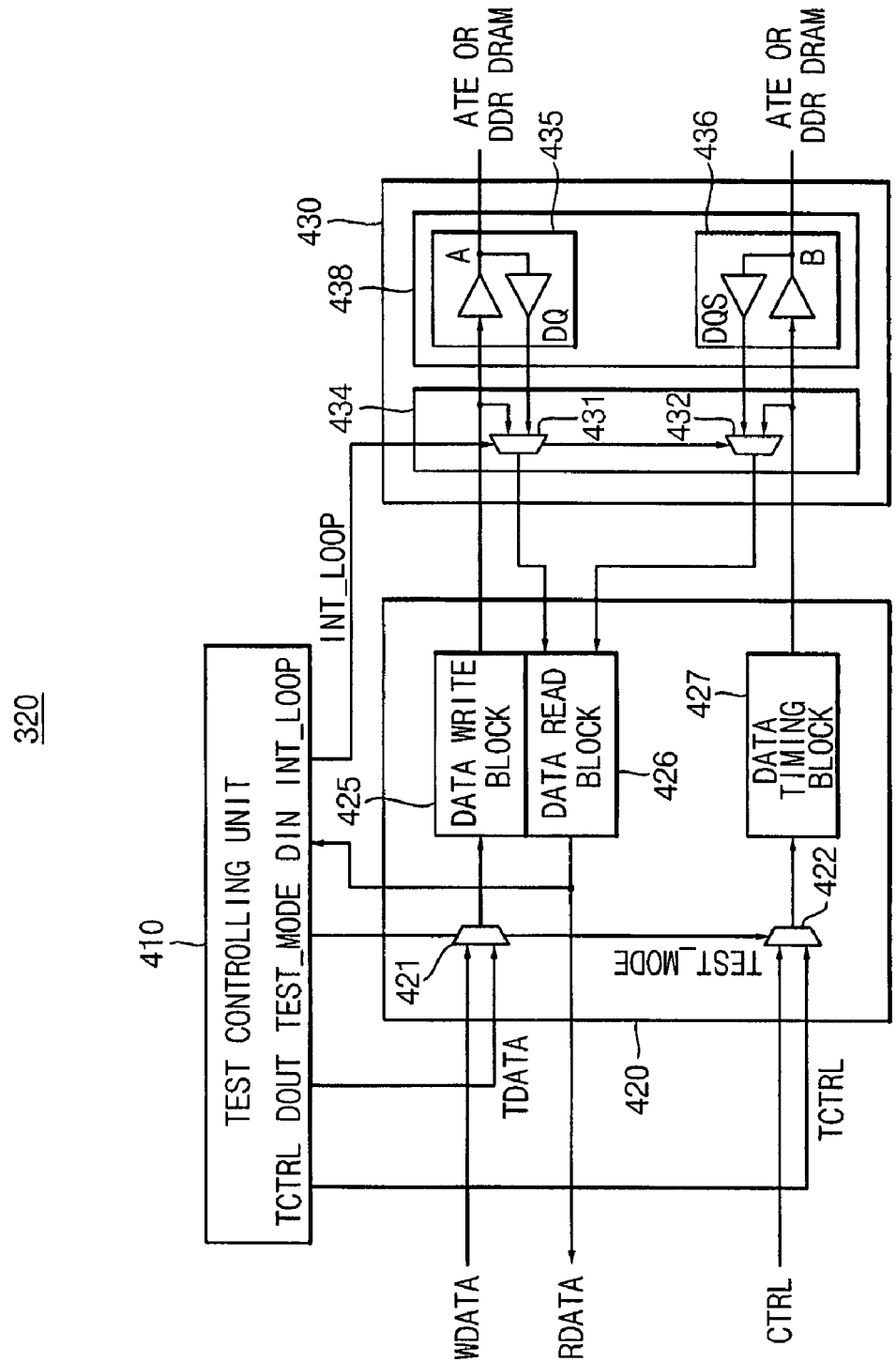
FIG. 5 is a block diagram illustrating one embodiment of the memory controller in FIG. 4.

FIG. 5 is a block diagram illustrating the memory controller in FIG. 4.

Referring to FIG. 5, the memory controller 320 includes a test controlling unit 410, a data transmission unit 420 and a data I/O unit 430.

The test controlling unit 410 receives a test signal representing a test mode from an external source, and generates test data TDATA to transmit the generated test data TDATA to the data transmission unit 420.

The data transmission unit 420 includes first and second multiplexers 421 and 422, a data write block 425, a data read block 426 and a data timing block 427.

The data transmission unit 420 generates a data read timing signal in a test mode, and transmits the generated test data TDATA synchronized with the data read timing signal and the data read timing signal. For example, in a DDR DRAM device, the data read timing signal may correspond to a data read strobe signal.

Also, the data transmission unit 420 reads a feedback test data received from the data I/O unit 430 based on a feedback data read timing signal received from the data I/O unit 430. For example, in the DDR DRAM device, the data write timing signal may correspond to a data write strobe signal.

The data transmission unit 420 generates a data write timing signal in a non-test mode, and transmits data synchronized with the data write timing signal and the data write timing signal to the data I/O unit 430.

The data I/O unit 430 includes a selection unit 434 including third and a fourth multiplexers 331 and 332, and a feedback circuit 436 including a data feedback circuit 435 and a data timing feedback circuit 436.

The data I/O unit 430 feeds back the transmitted test data and the transmitted data read timing signal to the data transmission unit 420 in a test mode.

Also, the data I/O unit 430 outputs the transmitted data and the transmitted data read timing signal to the ATE 330 in a non-test mode.

Hereinafter, the operation of the memory controller 320 will be described with reference to FIGS. 6 through 8.

Figure 6:
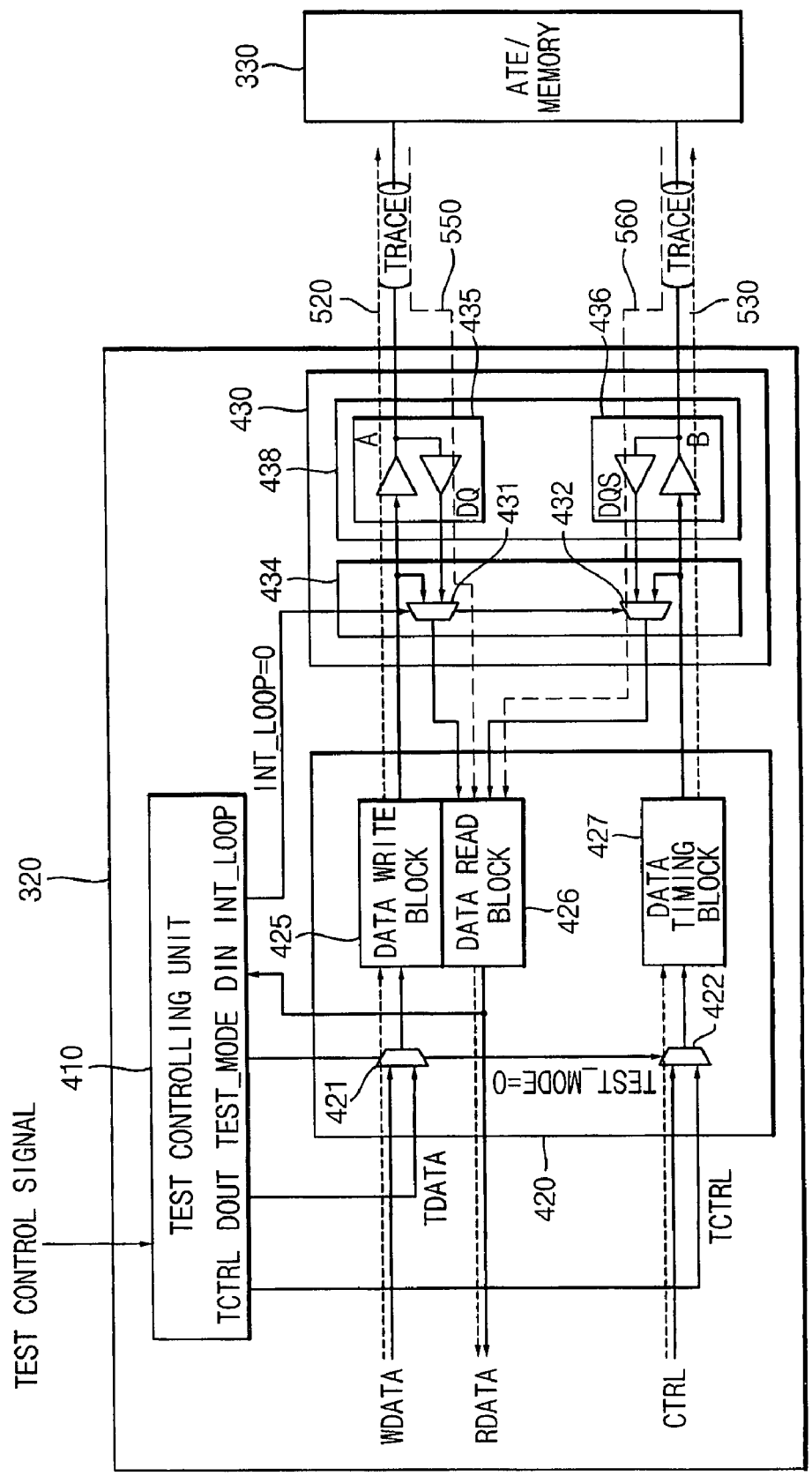
FIG. 6 is a block diagram illustrating the operation of the memory controller in a non-test mode.

FIG. 6 is a block diagram illustrating the operation of the memory controller 320 in a non-test mode.

In a non-test mode, a procedure where the memory controller 320 writes data to the ATE is described as follows.

The first multiplexer 421 selects data WDATA from data WDATA transmitted from an external source and the test data TDATA transmitted from the test controlling unit 410 based on a test mode signal received from the test controlling unit 410 to transmit the selected data WDATA to the data write block 425.

The second multiplexer 422 selects a control signal CTRL from the control signal CTRL received from the external source and a test control signal TCTRL transmitted from the test controlling unit 410 based on the test mode to transmit the selected control signal CTRL to the data timing block 427.

The data timing block 427 outputs a data write timing signal, and the data write block 425 outputs data synchronized with the data write timing signal received from the data timing block 427.

Figure 9:
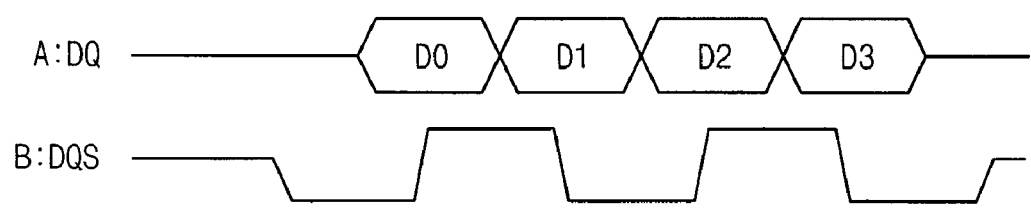
FIG. 9 is a timing diagram illustrating a procedure where the memory controller outputs data to the memory device in a non-test mode.

FIG. 9 is a timing diagram illustrating a procedure where the memory controller outputs data to the memory device in a non-test mode.

The data timing block 427 generates a data write strobe signal DQS based on a clock received from an external source, and the data write block 425 outputs data DQ at a rising edge and a falling edge of the data write strobe signal DQS.

The data I/O unit 430 transmits data 520 and a data write timing signal 530 received from the data transmission unit 420 to the memory controller 330.

In a non-test mode, a procedure where the memory controller 320 reads data from the ATE is described as follows.

The data I/O unit 430 receives data 550 and a data read timing signal 560 from the ATE 330, and outputs the data 550 and the data read timing signal 560 to the data read block 426. For example, in the DDR DRAM device, the data read timing signal 560 may correspond to a data read strobe signal.

The data read block 426 reads the data 550 from the ATE 330 based on the data read timing signal 560. The read data 550 is transmitted to the external source such as the CPU 110.

Figure 7:
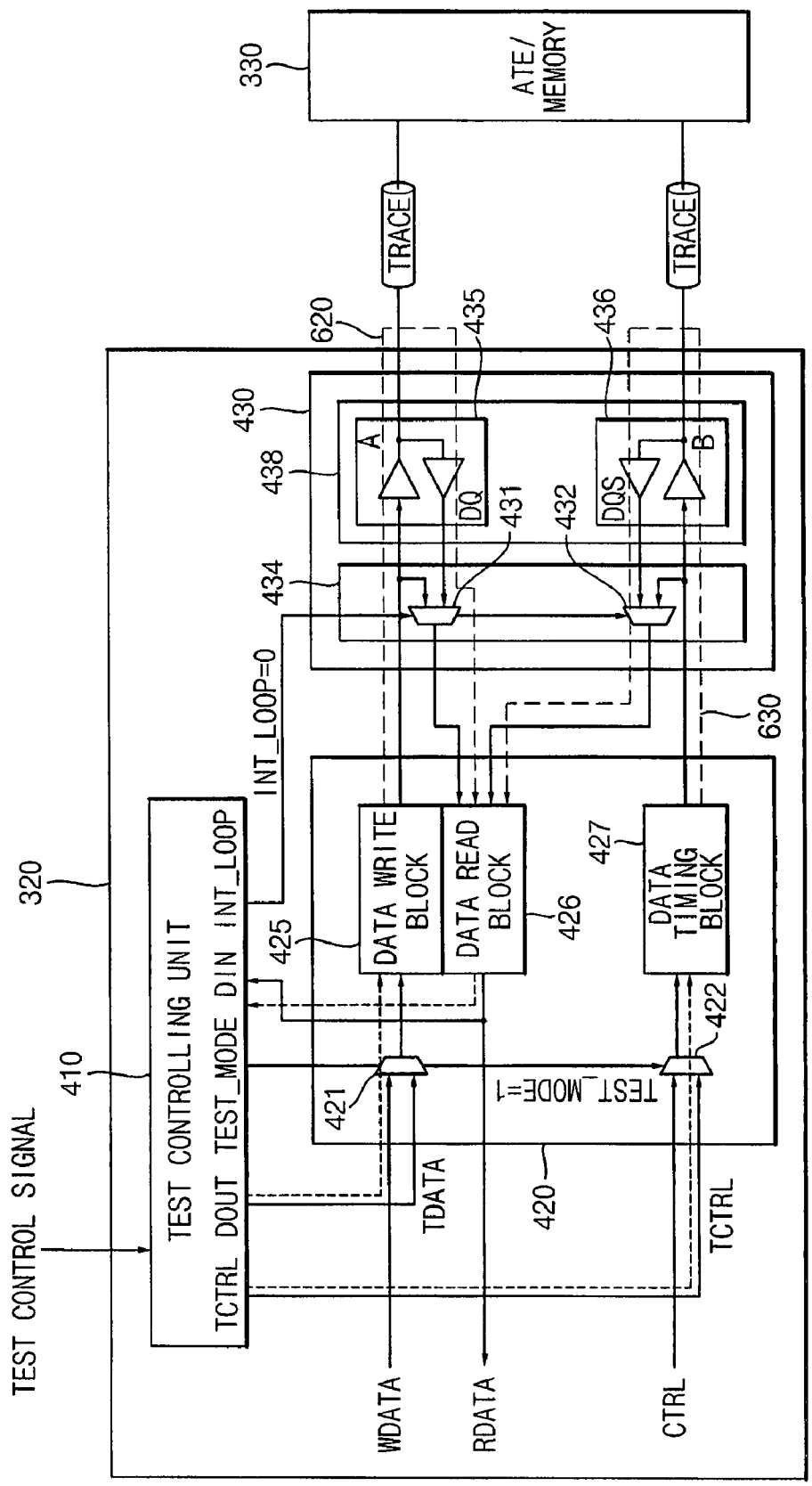
FIG. 7 is a block diagram illustrating the operation of the memory controller in a test mode according to an example embodiment of the present invention.

FIG. 7 is a block diagram illustrating the operation of the memory controller 320 in a test mode according to an example embodiment of the present invention.

A procedure of testing a memory controller 320 in a test mode is described as follows.

The test controlling unit 410 receives a test control signal 510 from an external source, and generates test data to output the generated test data. Also, the test controlling unit 410 outputs a test mode signal. For example, the external source may include the CPU 310 and the ATE 330.

The first multiplexer 421 selects the test data TDATA from the data WDATA and the test data TDATA based on the test mode signal to transmit the selected test data TDATA to the data write block 425.

The second multiplexer 422 selects the test control signal TCTRL from the control signal CTRL and the test control signal TCTRL based on the test mode to transmit the selected test control signal TCTRL to the data timing block 427.

The data timing block 427 outputs a data read timing signal, and the data write block 425 outputs data synchronized with the data read timing signal.

Figure 10:
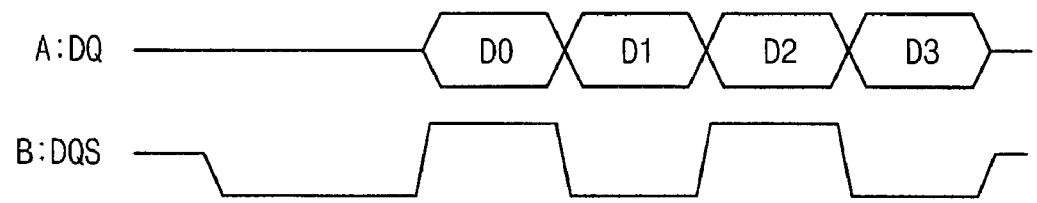
FIG. 10 is a timing diagram illustrating a procedure where the memory controller outputs test data to the memory device in a test mode.

FIG. 10 is a timing diagram illustrating a procedure where the memory controller outputs test data to the memory device in a test mode.

The data timing block 427 generates a data read strobe signal DQS based on a clock received from an external source, and the data write block 425 outputs data DQ at the center of the data write strobe signal DQS.

The data I/O unit 430 feeds back data 620 and a data read timing signal 630 received from the data transmission unit 410 based on an internal loop control signal INT_LOOP received from the test controlling unit 410 to transmit the feedback data 610 and the feedback data read timing signal to the data read block 426. Each of the feedback data 620 and the feedback data read timing signal 630 may correspond to a signal transmitted to the ATE 330.

The data read block 426 reads the feedback data 620 received from the ATE 330 based on the feedback data read timing signal 630. The read data 620 is transmitted to the test controlling unit 410.

The test controlling unit 410 compares the read data 620 and the generated test data to test the memory controller 320.

Figure 8:
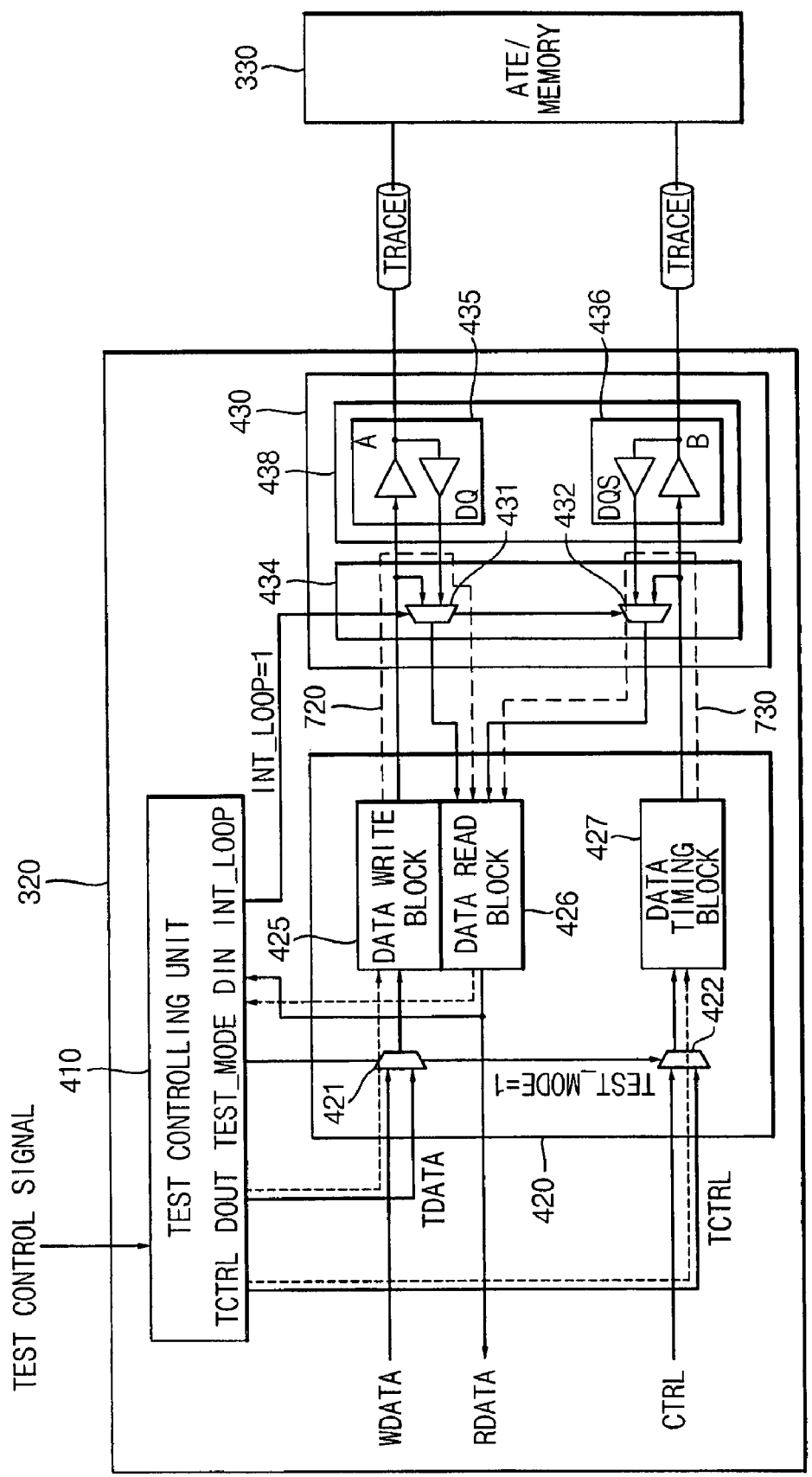
FIG. 8 is a block diagram illustrating the operation of the memory controller in a test mode according to another example embodiment of the present invention.

FIG. 8 is a block diagram illustrating the operation of the memory controller 320 in a test mode according to another example embodiment of the present invention.

A procedure of testing a memory controller 320 in a test mode is described as follows.

The test controlling unit 410 receives a test control signal 510 from an external source, and generates test data TDATA to output the generated test data. Also, the test controlling unit 410 outputs a test mode signal. For example, the external source may include the CPU 310 and the ATE 330.

The first multiplexer 421 selects the test data TDATA from the data WDATA and the test data TDATA based on the test mode signal to transmit the selected data TDATA to the data write block 425.

The second multiplexer 422 selects the test control signal TCTRL from the control signal CTRL and the test control signal TCTRL based on the test mode to transmit the selected test control signal TCTRL to the data timing block 427.

The data timing block 427 outputs a data read timing signal, and the data write block 425 outputs data synchronized with the data read timing signal.

Referring back to FIG. 10, the data timing block 427 generates a data read strobe signal DQS based on a clock received from an external source, and the data write block 425 outputs data DQ at the center of the data write strobe signal DQS.

The data I/O unit 430 feeds back data 720 and a data read timing signal 730 received from the data transmission unit 410 based on an internal loop control signal INT_LOOP received from the test controlling unit 410 to transmit the feedback data 720 and the feedback data read timing signal to the data read block 426. Each of the feedback data 720 and the feedback data read timing signal 730 may correspond to a direct feedback signal received from the data transmission unit 420.

The data read block 426 reads the direct feedback data 720 received from the data transmission unit 420 based on the direct feedback data read timing signal 730. The read data 720 is transmitted to the test controlling unit 410.

The test controlling unit 410 compares the read data 720 and the generated test data to test the memory controller 320.

As described above, a memory controller with a self-test function according to above example embodiments of the present invention may feed back data and a data timing signal to perform a fast self-test.

While the example embodiments of the present invention and their advantages have been described in detail, it should be understood that various changes, substitutions and alterations may be made herein without departing from the scope of the invention.

What is claimed is:

1. A memory controller with a self-test function, comprising:
   a test controlling unit configured to generate test data in a test mode;
   a data transmission unit configured to generate a data read timing signal to transmit the data read timing signal and the generated test data synchronized with the data read timing signal, wherein the test data is edge-aligned with the data read timing signal; and
   a data input/output (I/O) unit configured to feed back the transmitted test data and the transmitted data read timing signal to the data transmission unit, such that the data transmission unit receives fed-back test data and a fed-back data read timing signal, and
   wherein the data transmission unit reads the fed-back test data based on the fed-back data read timing signal, and the test controlling unit compares the fed-back test data with the generated test data.

2. The memory controller of claim 1, wherein the data transmission unit generates a data write timing signal and transmits the generated data write timing signal and non-test data synchronized with the generated data write timing signal, in a non-test mode.

3. The memory controller of claim 2, wherein the data transmission unit comprises:
   a data timing block configured to generate the data read timing signal and configured to transmit the generated data read timing signal; and
   a data write block configured to transmit the generated test data synchronized with the generated data read timing signal to the data I/O unit.

4. The memory controller of claim 3, wherein the data transmission unit further comprises a data read block configured to receive the fed-back test data and the fe-dback data read timing signal from the data I/O unit, and configured to read the received fed-back test data based on the fed-back data read timing signal.

5. The memory controller of claim 1, wherein the data 110 unit directly feeds back the transmitted test data and the transmitted data read timing signal.

6. The memory controller of claim 1, wherein the data 110 unit feeds back the transmitted test data that is to be outputted to an external source and the transmitted data read timing signal that is to be outputted to the external source.

7. The memory controller of claim 6, wherein the external source corresponds to one of a memory device and a memory controller test device.

8. The memory controller of claim 6, wherein the data 110 unit comprises:
   a data feedback circuit configured to feed back the transmitted test data that is to be outputted to an external source; and
   a data timing feedback circuit configured to feed back the transmitted data read timing signal that is to be outputted to the external source.

9. The memory controller of claim 1, wherein the data 110 unit directly feeds back the transmitted test data and the transmitted data read timing signal, or feeds back the transmitted test data that is to be outputted to an external source and the transmitted data read timing signal that is to be outputted to the external source, based on an internal loop control signal received from the test controlling unit.

10. The memory controller of claim 9, wherein the data 110 unit includes a selection unit configured to select one of first signals and second signals based on the internal loop control signal, the first signals corresponding to the direct fed-back test data and the direct fed-back data read timing signal, and the second signals corresponding to the transmitted test data that is to be outputted to an external source and the transmitted data read timing signal that is to be outputted to the external source.

11. The memory controller of claim 10, wherein the data I/O unit comprises:
   a data feedback circuit configured to feed back the generated test data that is to be outputted to the external source; and
   a data timing feedback circuit configured to feed back the generated data read timing signal that is to be outputted to the external source.

12. The memory controller of claim 1, wherein the test controlling unit determines an operation mode based on a test control signal received from an external source, the operation mode including one of the test mode and a non-test mode.

13. The memory controller of claim 12, wherein the external source corresponds to one of a central processing unit (CPU) and a memory controller test device.

14. A double data rate (DDR) memory controller with a self-test function, comprising:
   a test controlling unit configured to generate test data in a test mode;
   a data transmission unit configured to generate a data read strobe signal to transmit the data read strobe signal and the generated test data synchronized with the data read strobe signal, wherein the test data is edge-aligned with the data read timing signal; and
   a data I/O unit configured to feed back the transmitted test data and the transmitted data read strobe signal to the data transmission unit, such that the data transmission unit receives fed-back test data and a fed-back data read strobe signal, and
   wherein the data transmission unit reads the fed-back test data based on the fed-back data read strobe signal, and the test controlling unit compares the fed-back test data with the generated test data.

15. The DDR memory controller of claim 14, wherein the data transmission unit generates a data write strobe signal and transmits the generated data write timing signal and non-test data synchronized with the generated data write strobe signal, in a non-test mode.

16. The DDR memory controller of claim 15, wherein the data transmission unit comprises:
   a data timing block configured to generate the data read strobe signal and configured to transmit the generated data read strobe signal; and
   a data write block configured to transmit the generated test data synchronized with the generated data read strobe signal to the data I/O unit.

17. The DDR memory controller of claim 16, wherein the data transmission unit further comprises a data read block configured to receive the fed-back test data and the fed-back data read strobe signal from the data 110 unit, and configured to read the received fed-back test data based on the fed-back data read strobe signal.

18. The DDR memory controller of claim 14, wherein the data I/O unit directly feeds back the transmitted test data and the transmitted data read strobe signal, or feeds back the transmitted test data that is to be outputted to an external source and the transmitted data read strobe signal that is be outputted to the external source, based on an internal loop control signal received from the test controlling unit.

19. A method of testing a memory controller, comprising:
   generating test data in a test mode;

generating a data read timing signal to transmit the generated test data synchronized with the data read timing signal and the data read timing signal, wherein the test data is edge-aligned with the data read timing signal;

feeding back the transmitted test data and the transmitted data read timing signal to generate fed-back test data and a fed-back data read timing signal; and reading the fed-back test data based on the fed-back data read timing signal to compare the fed-back test data with the generated test data.

20. The method of claim 19, wherein feeding back the transmitted test data and the transmitted data read timing signal comprises:

directly feeding back the transmitted test data and the transmitted data read timing signal, or feeding back the transmitted test data that is to be outputted to an external source and the transmitted data read timing signal that is to be outputted to the external source.

* * * * *

UNITED STATES PATENT AND TRADEMARK OFFICE
CERTIFICATE OF CORRECTION

PATENT NO. : 7,657,803 B2　　　　　　　　　　　　　　　　　　　　　　　　　Page 1 of 1
APPLICATION NO. : 11/821626
DATED : February 2, 2010
INVENTOR(S) : Kwan-Yeob Chae It is certified that error appears in the above-identified patent and that said Letters Patent is hereby corrected as shown below:

Column 9, line 39, remove "110" and insert --I/O--
Column 9, line 42, remove "110" and insert --I/O--
Column 9, line 49, remove "110" and insert --I/O--
Column 9, line 57, remove "110" and insert --I/O--
Column 9, line 64, remove "110" and insert --I/O--
Column 10, line 56, remove "110" and insert --I/O--

Signed and Sealed this

Fourth Day of May, 2010

David J. Kappos
*Director of the United States Patent and Trademark Office*